(12) United States Patent
Aggarwal

(10) Patent No.: US 7,085,981 B2
(45) Date of Patent: Aug. 1, 2006

(54) METHOD AND APPARATUS FOR GENERATING TEST DATA SETS IN ACCORDANCE WITH USER FEEDBACK

(75) Inventor: Charu C. Aggarwal, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 474 days.

(21) Appl. No.: 10/457,333

(22) Filed: Jun. 9, 2003

(65) Prior Publication Data

US 2004/0250188 A1    Dec. 9, 2004

(51) Int. Cl.
*G06F 11/00*    (2006.01)
*G06F 7/00*    (2006.01)

(52) U.S. Cl. .................. 714/738; 707/102; 717/24; 706/12

(58) Field of Classification Search .............. None
See application file for complete search history.

(56) References Cited

U.S. PATENT DOCUMENTS

| | | | | |
|---|---|---|---|---|
| 5,982,378 | A * | 11/1999 | Kato | 345/582 |
| 6,539,391 | B1 * | 3/2003 | DuMouchel et al. | 707/101 |
| 6,789,069 | B1 * | 9/2004 | Barnhill et al. | 706/12 |
| 6,941,287 | B1 * | 9/2005 | Vaidyanathan et al. | 706/12 |
| 2002/0052882 | A1 * | 5/2002 | Taylor | 707/104.1 |
| 2002/0183966 | A1 * | 12/2002 | Mishra et al. | 702/179 |
| 2002/0188507 | A1 * | 12/2002 | Busche | 705/14 |
| 2003/0009470 | A1 * | 1/2003 | Leary | 707/100 |
| 2004/0103394 | A1 * | 5/2004 | Manda et al. | 717/126 |
| 2004/0107386 | A1 * | 6/2004 | Burdick et al. | 714/38 |
| 2004/0131280 | A1 * | 7/2004 | Reiners | 382/289 |

OTHER PUBLICATIONS

"Banner Software Releases Test Data Generator", Redmondmag.com Magazine, Feb. 9, 2000, by Scott Bekker, accessed on the internet on Nov. 16, 2005 at http://redmondmag.com/news/article.asp?EditorialsID=1021.*
Aggarawal et al., "Mining Associations With The Collective Strength Approach", Nov.-Dec. 2000, IEEE Transactions on Knowledge and Data Engineering, vol. 13, Issue 6, pp. 863-873.*

* cited by examiner

*Primary Examiner*—Guy Lamarre
*Assistant Examiner*—John P. Trimmings
(74) *Attorney, Agent, or Firm*—Ryan, Mason & Lewis, LLP

(57) ABSTRACT

Techniques for processing data sets and, more particularly, constructing a synthetic data set (test data set) from real data sets (input data sets) in accordance with user feedback. The technique mimics real data sets effectively to generate the corresponding synthetic ones. Multiple real data sets may be used to create a test data set which combines the characteristics of these multiple data sets. Users of the technique have the ability to modify the characteristics of the data sets to create a new data set which has features that a user may desire. For example, a user may change the shape or size of, or distort the different patterns in the data to create a new data set. A user may also choose to inject noise into the system.

23 Claims, 5 Drawing Sheets

METHOD AND APPARATUS FOR GENERATING TEST DATA SETS IN ACCORDANCE WITH USER FEEDBACK

FIELD OF THE INVENTION

The present invention is related to a technique for processing data sets and, more particularly, for constructing a synthetic data set (i.e., test data set) from a real data set in accordance with user feedback.

BACKGROUND OF THE INVENTION

In recent years, a number of important data mining methods have been developed for problems such as clustering, similarity search, outlier detection, etc. All of these problems require the generation of data sets to test the quality of the results. Most current techniques generate the test data sets via techniques which generate data from standard probabilistic distributions, see, e.g., tools such as Datatect (available from Banner Software Inc. of Sacramento, Calif.), and companies such as Spatial Solutions Inc. (Hauppauge, N.Y.) and Crescent Consultants Limited (Derby, England).

For example, many data mining methodologies for the clustering problem assume that all the clusters in the data are of Gaussian shape and each data point is generated from one of these clusters. This may not often be the case with real data sets.

These techniques cannot capture the vagaries of real data sets effectively, which can contain clusters having arbitrary and irregular shape. Thus, a need exists for improved test data generation techniques which overcome these and other limitations.

SUMMARY OF THE INVENTION

The present invention provides techniques for processing data sets and, more particularly, constructing a synthetic (test) data set from a real data set in accordance with user feedback.

For example, in one aspect of the invention, a method of generating at least one test data set from at least one input data set comprises the following steps. First, at least one input data set is obtained. Then, at least one test data set is constructed from the at least one input data set based on characteristics associated with the at least one input data set and user input.

Advantageously, the process is able to mimic real data sets (input data sets) effectively to generate the corresponding synthetic ones (test data sets). The density estimates of different data sets may be determined and combined to create a new density estimate which is a combination of the behavior of the different data sets. This combination may be used to create a new data set which can combine the characteristics of multiple data sets.

Another advantageous property is the users ability to modify the characteristics of the input data sets or combined input data sets to create a new data set which has some new features that a user may desire. It is possible for a user to attribute more or less weight to a particular data set depending upon the level of importance that he or she attaches to it. In addition, the user is able to change the shape or size of, or distort, the different patterns in the data to create a new data set which combines the characteristics of different data sets in a novel way. A user may also choose to inject noise into the system to test the effects of noise on a data mining methodology. Such a technique results in an overall data generation process which is highly tailored to the specifics of the different data sets. The present invention further provides techniques for characterizing the distribution of the data sets.

These and other objects, features, and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
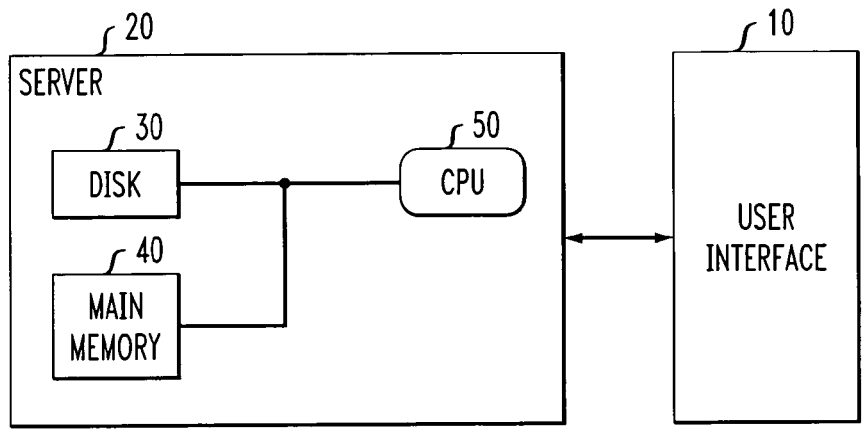
FIG. 1 is a block diagram illustrating a hardware implementation suitable for employing test data set generation methodologies, according to an embodiment of the present invention.

The following description will illustrate the invention using an exemplary data processing system architecture. It should be understood, however, that the invention is not limited to use with any particular system architecture. The invention is instead more generally applicable to any data processing system in which it is desirable to perform efficient and effective test data generation.

As will be illustrated in detail below, the present invention introduces techniques for simulating real data sets and combining the characteristics of multiple data sets. Modifications may be applied to these data sets to create one final data set which contains all the characteristics of the real data sets as well as the user specified changes to the characteristics of the current data set.

The data sets which are used for the purpose of generation and whose characteristics are combined to create the new set of points are denoted as R(1) . . . R(k). Therefore, the first step is to find a way to characterize the distribution of the data in the data space. In order to create a new data set, from an existing set of data points, the method of density estimation may be used. In density estimation, the probabilistic distribution of the data is found at each point in the space. A well known method of finding data distributions is the method of kernel density estimation.

The idea in kernel density estimation is to provide a continuous estimate of the density of the data at a given point. There are two kinds of methods for performing kernel density estimation: parametric and non-parametric. In parametric methods, it is assumed that the kernel function ƒ(x) belongs to some parametric family of distributions. The parameters of this distribution are estimated using the data set at hand. In non-parametric methods, nothing is assumed about the nature of the data distribution. Rather, the value of the density at a given point is estimated as the sum of the smoothed values of kernel functions $K_h(.)$ associated with each point in the data set. Each kernel function is associated with a smoothing parameter h which determines the level of smoothing created by the function. The kernel estimation ƒ(x) based on n data points and kernel function $K_h(.)$ is defined as follows:

$$f(x) = \frac{1}{n}\sum\nolimits_{(i=1)+}^{n} K_h(x - X_i).$$

Thus, each discrete point $X_i$ in the data set is replaced by a continuous function $K_h(.)$ which peaks at $X_i$ and has a variance which is determined by smoothing parameter h. An example of such a distribution would be a normal distribution which is centered at $X_i$, and whose standard deviation is equal to the kernel width. This results in:

$$K_h(x - X_i) = \frac{1}{\sqrt{2\pi}h} e^{\frac{-(\|x - X_u\|^2)}{2h^2}}$$

The overall effect of kernel density estimation is to convert the discrete data set into a continuous density estimate by replacing each point with a smoothed bump. The result is a continuous distribution in which the random artifacts are suppressed and the density behavior provides a global overview of the dense, as well as sparsely populated regions of the data.

Kernel density estimation also provides a clear way to understand the different clusters in the data, since the clusters can be defined to be regions in the data in which the density is above a certain threshold. Once such clusters have been identified, it is possible to develop techniques which can generate data sets that have distributions based on the density of the original data set. In accordance with the invention, a critical role in this process is played by the user, who has the ability to modify various characteristics of the data in this process. These characteristics may include the size and shape of the clusters and the level of noise that is present in the data. Various techniques are discussed in accordance with the invention so that user input may be used in the process of affecting the shape and size of the different clusters.

Referring initially to FIG. 1, a block diagram illustrates a hardware implementation suitable for employing test data set generation methodologies according to an embodiment of the invention. As illustrated, an exemplary system comprises a user interface 10, such as a client device, coupled to a server 20. Server 20 may comprise a central processing unit (CPU) 50 coupled to a main memory 40 and a disk 30.

The synthetic data set generation computations of the invention are performed at CPU 50 on server 20 and sent to client device 10. It is to be understood that client device 10 issues the requests for synthetic data set generation and also supplies the input data sets to server 20. However, all or portions of the data sets to be processed may already be available at the server (e.g., on disk 30). Main memory 40 is used in order to store some or all of the intermediate results performed during the computations. Results of these computations are then returned to the requesting client device 10 and presented to the client. It is also to be understood that the system need not be implemented in a client/server arrangement. For example, user interface 10 may simply be a display device with which a user interfaces with computing system 20.

In one preferred embodiment, software components including instructions or code for performing the methodologies of the invention, as described herein, may be stored in one or more memory devices described above with respect to server 20 and, when ready to be utilized, loaded in part or in whole and executed by CPU 50.

Figure 2:
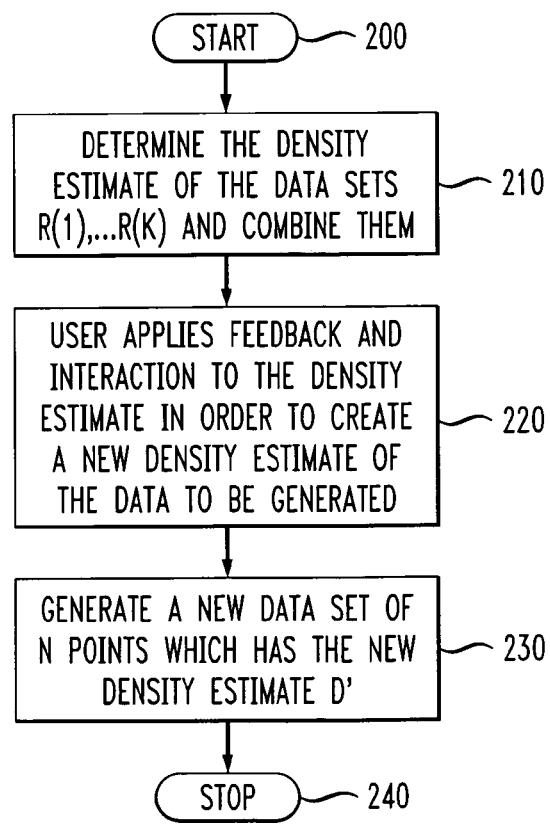
FIG. 2 is a flow diagram illustrating a test data set generation methodology, according to an embodiment of the present invention.

Referring now to FIG. 2, a flow diagram illustrates a test data set generation methodology, according to an embodiment of the present invention. The input to the process are k data sets, denoted by R(1) . . . R(k). Typically, the value of k is one, but in many cases, the value may also be much larger than one. The invention is not limited to a particular number of input data sets. The methodology starts at block 200 where data sets R(1) . . . R(k) are input to the system. Step 210 uses the density of the k different data sets R(1) . . . R(k) to create one new characterization of the data sets which is a combination of their different characterizations. A more detailed description of this process is provided in FIG. 3. In step 220, user-interaction is utilized to change the characterization of the data, so that the user-behavior is taken into account. This behavior could change the size or shape of the different clusters in the data or more noise could be injected into the data. A detailed description of this step is provided in FIG. 4. In step 230, the combined characterization of the data set is used to generate a new data set of N data points which has a new density estimate D'. A detailed description of this step is provided in FIG. 5. The methodology ends at block 240.

Figure 3:
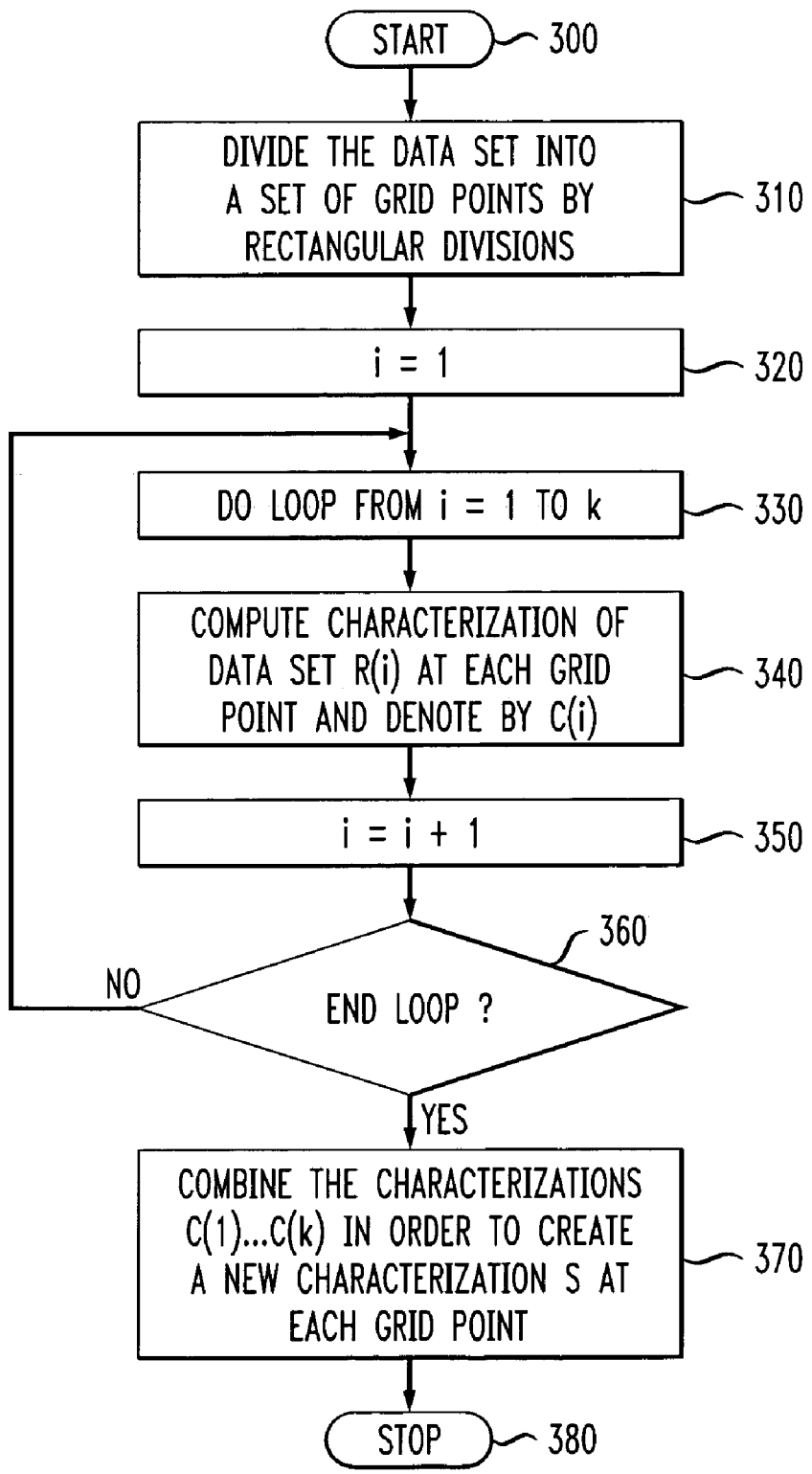
FIG. 3 is a flow diagram illustrating a density estimate determination methodology, according to an embodiment of the present invention.
Figure 7:
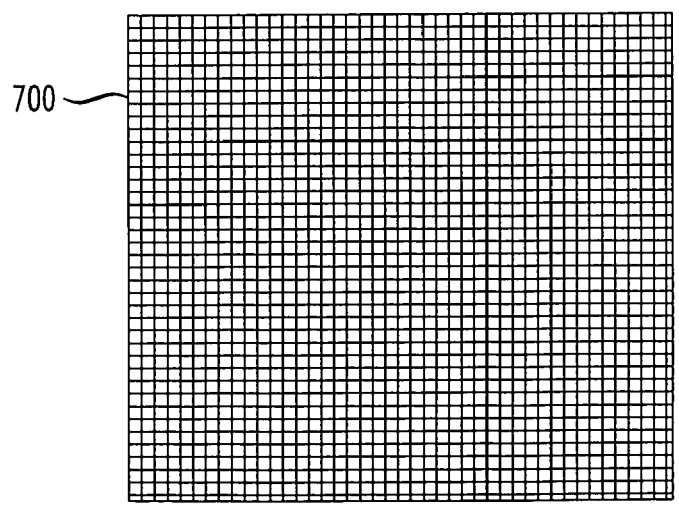
FIG. 7 illustrates an example of a grid structure for a 2-dimensional data set, according to an embodiment of the present invention.

Referring now to FIG. 3, a flow diagram illustrates a density estimate determination methodology, according to an embodiment of the present invention. This is a detailed description of step 210 of FIG. 2. The methodology starts at block 300 wherein data sets R(1) . . . R(k) are input. The next step of the process is to create a characterization of the data in terms of the different data sets. In order to create this characterization, each data set is divided into a number of grid points in step 310. The grid points are determined by discretizing each dimension in the data on an equi-width basis. Thus, the data is divided into a number of different ranges for each dimension. This creates a number of discrete points in the data space, referred to as grid points. A possible grid-discretization of the data is illustrated in FIG. 7, which illustrates a 2-dimensional data set 700, in which the data is divided into a number of grid-squares. For a higher dimensional data set, the discretization would result in hyper-rectangles and hyper-cubes. The characterization of the data is measured at these discrete grid points. For the purpose of this invention, the computation of data characterization refers to the computation of the data density at each of the grid points. The process of computation of data density at a grid point is well known, see, e.g., B. W. Silverman, "Density Estimation for Statistics and Data Analysis," Chapman and Hall, 1986, the disclosure of which is incorporated by reference herein, and has been described in detail above.

In step 320, the iteration counter i is set to 1 for the first data set. This iteration counter is used to determine the characterizations of the individual and different data sets. The loop for computing the characterization of each data set is set up in steps 330 through 360. Step 330 begins the loop from 1 to k. In step 340, the main step of the loop is executed in which the characterization of the data set R(i) is computed. This characterization comprises the values of the densities at the different grid points which were determined in step 310. The characterization of the data set R(i) is denoted by C(i). In step 350, the iteration counter i is incremented by 1 so that the loop may execute for the next data set. In step 360, the iteration counter is checked to ascertain whether it has exceeded the target value of k. If i has not exceeded k the loop executes using the next data set. If i has exceeded k, step 370 combines the characterizations of C(1) . . . C(k) to create the final characterization S. The details of the process of step 370 are described in FIG. 6. This methodology ends at block 380.

Figure 4:
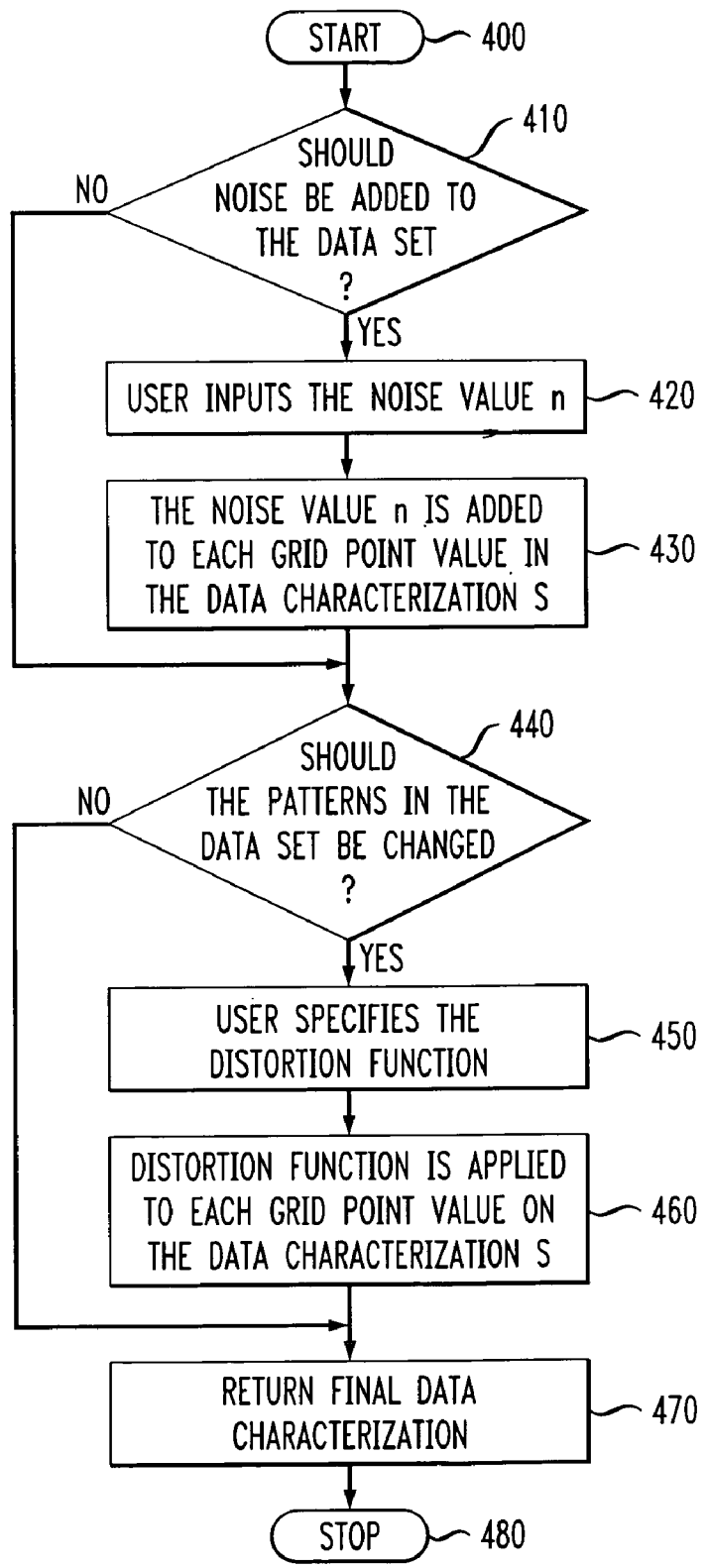
FIG. 4 is a flow diagram illustrating a user feedback methodology, according to an embodiment of the present invention.

Referring now to FIG. 4, a flow diagram illustrates a user feedback methodology, according to an embodiment of the present invention. This is a detailed description of step 220 of FIG. 2. The methodology starts at block 400. This process can be used to change the number and shape of the clusters in the data or increase the noise in the data. Step 410 checks whether it is desired to add noise to the data set. The user provides the feedback corresponding to this addition. The addition of noise to the data set will create sets of clusters which are embedded in a considerable amount of extraneous density of data. The noise value n is input by the user in step 420. This noise value n is added to each grid point value in the data characterization S in step 430. Step 440 checks whether the size and shape of the clusters in the data should be changed. If this is the case, then the user specifies the distortion function in step 450. It will be evident to those skilled in the art that by applying a mathematical function to the data characterization, it is possible to change the size, shape and density of the clusters in the data. For example, the density values in certain regions could be incremented, when it is desirable to add a cluster at that point. Similarly, it is possible to remove a cluster by finding the region in the data in which the density is above a certain threshold. Furthermore, by applying linear or non-linear functions to the density values computed at the different grid-points, a user may be able to change the size and shape of the different clusters in the data. The choice of how the data characterization is changed is left primarily to the user in step 450. In step 460, this distortion function is applied to the data characterization. The final data characterization at the different grid points is returned in step 470. The methodology ends at block 480.

Figure 5:
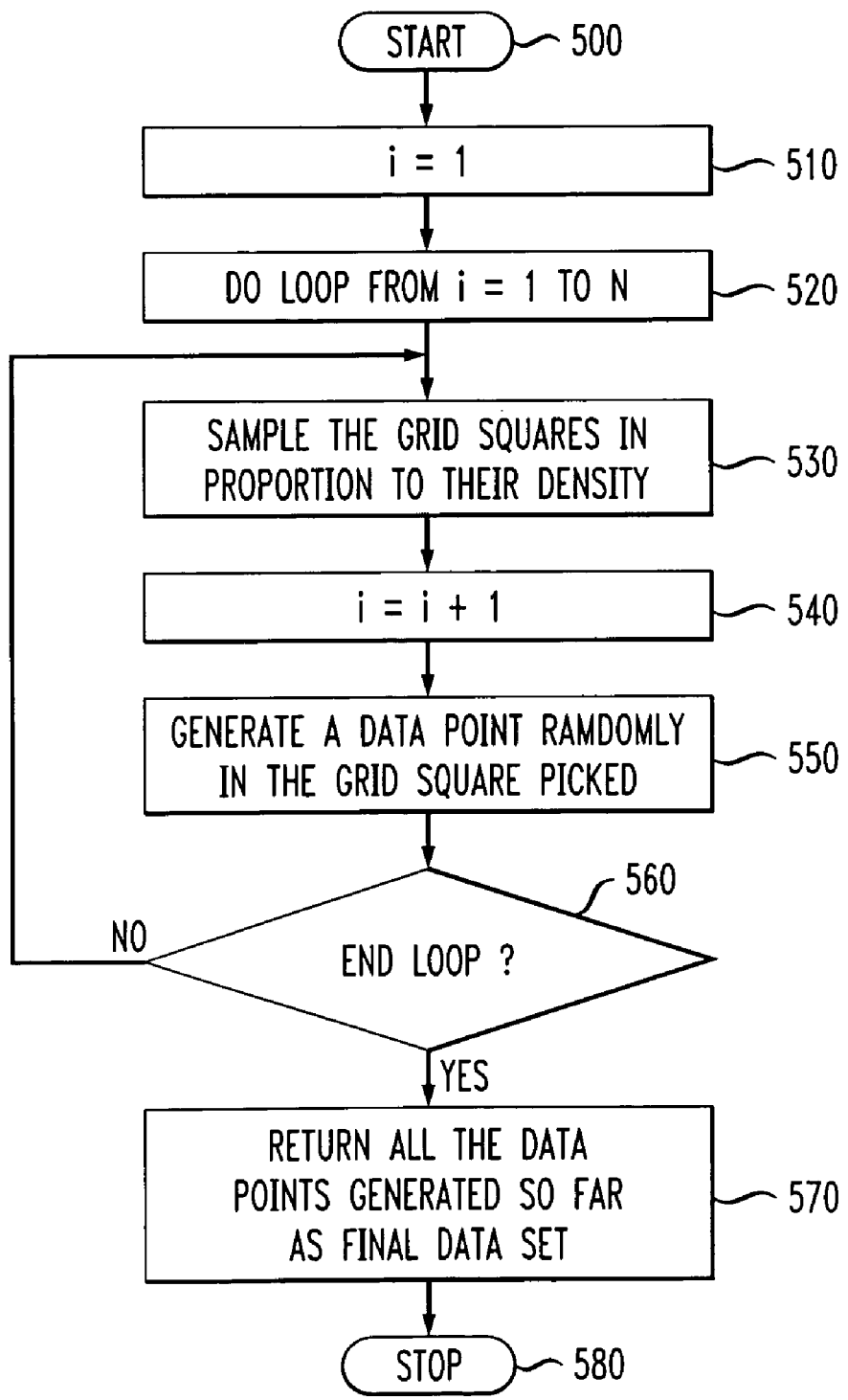
FIG. 5 is a flow diagram illustrating a final data point generation methodology, according to an embodiment of the present invention.

Referring now to FIG. 5, a flow diagram illustrates a final data point generation methodology, according to an embodiment of the present invention. This is a detailed description of step 230 of FIG. 2. A random sampling procedure is used and the different grid squares are sampled in proportion to their density. A data point is generated uniformly at random inside each grid square. This methodology starts a block 500 and the number of data points N, and the data characterization S are input. In step 510, the iteration counter i is initialized to 1. In step 520, an iterative loop for i which varies from 1 through the number of data points N is set up. In step 530, the grid points in proportion to their density are sampled. In step 540, the iteration counter i is incremented by 1. In step 550, a data point is randomly generated in the chosen grid square. In step 560, it is determined if i=N, ending the loop. If the loop has not ended the methodology returns to block 530 to sample a grid square. If the loop has ended, the methodology outputs a generated final data set in step 570 and the methodology terminates at step 580.

Figure 6:
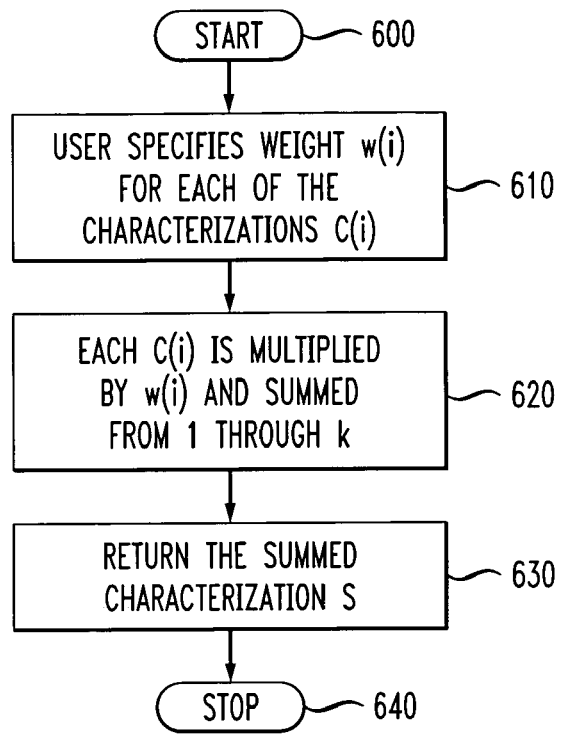
FIG. 6 is a flow diagram illustrating a data set characterization combination methodology, according to an embodiment of the present invention.

Referring now to FIG. 6, a flow diagram illustrates a data set characterization combination methodology, according to an embodiment of the present invention. This is a detailed description of step 370 of FIG. 3. This technique provides a way to combine the different data sets while providing more or less importance to one or the other. This methodology starts at block 600 and characterizations C(1) . . . C(k) are input. In step 610 the user enters the weight w(i) which determines the importance of each data set and which is used to generate the final synthetic data. In step 620, the values of characterizations in each C(i) are multiplied by w(i). These values are summed from 1 through k, the total number of data sets. The result is the summed characterization S which is returned in step 630. The methodology ends at block 640.

Accordingly, as described herein, the present invention provides techniques for processing data sets and, more particularly, for constructing a synthetic (test) data set from a real data set in accordance with user feedback. The inventive techniques are applicable to a large number of applications such as clustering, similarity search, and outlier detection.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of generating at least one test data set from at least one input data set, the test data set being capable of determining quality of results from a data mining technique performed in a computer, the method comprising the steps of:

obtaining the at least one input data set; and constructing the at least one test data set from the at least one input data set based on characteristics associated with the at least one input data set and user input resulting in at least a changing of a shape of one or more clustered regions in data of the at least one input data set.

2. The method of claim 1, wherein the at least one input data set is from a data mining application.

3. The method of claim 1, wherein the user input comprises injection of noise in association with the at least one input data set.

4. The method of claim 1, wherein the user input results in a reduction of size of clustered regions in data of the at least one input data set.

5. The method of claim 1, wherein the user input results in an expansion of size of clustered regions in data of the at least one input data set.

6. The method of claim 1, wherein the input data set obtaining step comprises obtaining multiple input data sets such that the test data set is constructed by combining characteristics of the multiple input data sets.

7. The method of claim 6, wherein combining characteristics of the multiple input data sets comprises:

specifying a weight for each of the characteristics;

attributing the weight to the characteristics; and summing weighted characteristics.

8. The method of claim 1, wherein the step of constructing the at least one test data set further comprises the steps of:

separating the at least one input data set into a number of grid squares;

estimating a function of density at a center of each grid square;

sampling the grid squares in proportion to their density; and inserting a data point uniformly at random within each grid square.

9. The method of claim 8, wherein, in the step of sampling the grid squares in proportion to their density, the density is modified by adding noise whose parameters are determined by the user.

10. The method of claim 8, wherein, in the step of sampling the grid squares in proportion to their density, the density is modified by applying a distortion function whose definition and parameters are determined by the user.

11. The method of claim 10, wherein the distortion function changes the size and shape of clustered regions in the test data set.

12. Apparatus for generating at least one test data set from at least one input data set, the test data set being capable of determining quality of results from a data mining technique performed in a computer, the apparatus comprising:
   a memory; and
   at least one processor coupled to the memory and operative to: (i) obtain at least one input data set; and (ii) construct at least one test data set from the at least one input data set based on characteristics associated with the at least one input data set and user input resulting in at least a changing of a shape of one or more clustered regions in data of the at least one input data set.

13. The apparatus of claim 12, wherein the at least one input data set is from a data mining application.

14. The apparatus of claim 12, wherein the user input comprises injection of noise in association with the at least one input data set.

15. The apparatus of claim 12, wherein the user input results in a reduction of size of clustered regions in data of the at least one input data set.

16. The apparatus of claim 12, wherein the user input results in an expansion of size of clustered regions in data of the at least one input data set.

17. The apparatus of claim 12, wherein the input data set obtaining operation comprises obtaining multiple input data sets such that the test data set is constructed by combining characteristics of the multiple input data sets.

18. The apparatus of claim 17, wherein combining characteristics of the multiple input data sets comprises:

specifying a weight for each of the characteristics;
attributing the weight to the characteristics; and
summing weighted characteristics.

19. The apparatus of claim 12, wherein the constructing the at least one test data set operation further comprises:
   separating the at least one input data set into a number of grid squares;
   estimating a function of density at a center of each grid square;
   sampling the grid squares in proportion to their density; and
   inserting a data point uniformly at random within each grid square.

20. The apparatus of claim 19, wherein, in the sampling the grid squares in proportion to their density operation, the density is modified by adding noise whose parameters are determined by the user.

21. The apparatus of claim 19, wherein, in the sampling the grid squares in proportion to their density operation, the density is modified by applying a distortion function whose definition and parameters are determined by the user.

22. The apparatus of claim 21, wherein the distortion function changes the size and shape of clustered regions in the test data set.

23. An article of manufacture for generating at least one test data set from at least one input data set, the test data set being capable of determining quality of results from a data mining technique performed in a computer, the article of manufacture comprising a machine readable medium containing one or more programs which when executed implement the steps of:
   obtaining the at least one input data set; and
   constructing the at least one test data set from the at least one input data set based on characteristics associated with the at least one input data set and user input resulting in at least a changing of a shape of one or more clustered regions in data of the at least one input data set.

* * * * *